(12) United States Patent
Holsteen et al.

(10) Patent No.: US 10,943,959 B1
(45) Date of Patent: Mar. 9, 2021

(54) DISPLAY DEVICE WITH A LIGHT MODULATING LAYER

(71) Applicant: Apple Inc., Cupertino, CA (US)

(72) Inventors: Aaron L. Holsteen, Stanford, CA (US); Chaohao Wang, Sunnyvale, CA (US); Cheng Chen, San Jose, CA (US); Jun Li, San Jose, CA (US); Shih-Chyuan Fan Jiang, San Jose, CA (US); Xiaokai Li, Sunnyvale, CA (US); Young Cheol Yang, Sunnyvale, CA (US); Zhibing Ge, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 43 days.

(21) Appl. No.: 16/270,142

(22) Filed: Feb. 7, 2019

Related U.S. Application Data (60) Provisional application No. 62/630,684, filed on Feb. 14, 2018.

(51) Int. Cl.
| | |
|---|---|
| *H01L 27/32* | (2006.01) |
| *G02F 1/1335* | (2006.01) |
| *G02F 1/13363* | (2006.01) |
| *G02F 1/1333* | (2006.01) |
| *G02F 1/1347* | (2006.01) |

(52) U.S. Cl.
CPC ........ *H01L 27/3232* (2013.01); *G02F 1/1347* (2013.01); *G02F 1/13363* (2013.01); *G02F 1/13476* (2013.01); *G02F 1/133308* (2013.01); *G02F 1/133528* (2013.01); *G02F 1/133541* (2021.01)

(58) Field of Classification Search
CPC ............. H01L 27/3232; H01L 27/3225; G02F 1/13476; G02F 2001/133541; G02F 1/133528; G02F 1/13363; G02F 1/133308; G02F 1/1347; G02B 5/3025; G02B 5/3083
See application file for complete search history.

(56) References Cited

U.S. PATENT DOCUMENTS

| | | |
|---|---|---|
| 8,976,323 B2 | 3/2015 | Smithwick et al. |
| 9,274,333 B2 | 3/2016 | Hagood et al. |
| 10,170,030 B2 | 1/2019 | Perdices-Gonzalez et al. |

(Continued)

FOREIGN PATENT DOCUMENTS

JP 2008083510 A * 4/2008 ......... H01L 27/3232

*Primary Examiner* — Jia X Pan
(74) *Attorney, Agent, or Firm* — Treyz Law Group, P.C.; Joseph F. Guihan (57) ABSTRACT

An optical system may include equipment with a housing that is configured to receive external equipment such as a cellular telephone. The external equipment may include a display. To control the persistence of the display, the optical system may include a light modulating layer. The light modulating layer may switch between a transparent state in which display image light is passed through the light modulating layer to reach the viewer and an opaque state in which display image light is blocked by the light modulating layer from reaching the viewer. The light modulating layer may be placed in the transparent state for a portion of each display frame and the opaque state for the remaining portion of each display frame. The light modulating layer may be formed in the housing of the equipment that receives the external equipment or may be formed with the external equipment directly.

18 Claims, 6 Drawing Sheets

(56) References Cited

U.S. PATENT DOCUMENTS

| | | | |
|---|---|---|---|
| 2007/0138941 A1* | 6/2007 | Jin | H01L 27/3232 313/503 |
| 2011/0267279 A1* | 11/2011 | Alvarez Rivera | H01L 27/3232 345/173 |
| 2013/0044282 A1* | 2/2013 | Kuwabara | G02F 1/1333 349/96 |
| 2015/0228089 A1* | 8/2015 | Perdices-Gonzalez | G09G 3/36 345/592 |
| 2017/0351126 A1* | 12/2017 | Chu | G02F 1/13338 |
| 2019/0204676 A1* | 7/2019 | Park | G02B 30/26 |
| 2020/0057330 A1* | 2/2020 | Yamazaki | G02F 1/1368 |
| 2020/0124917 A1* | 4/2020 | Igarashi | G02F 1/1333 |

\* cited by examiner

DISPLAY DEVICE WITH A LIGHT MODULATING LAYER

This application claims priority to U.S. provisional patent application No. 62/630,684 filed on Feb. 14, 2018, which is hereby incorporated by reference herein in its entirety.

FIELD

This relates generally to optical systems, and, more particularly, to optical systems with a light modulating layer.

BACKGROUND

Optical systems may include a display that is used to provide images to a viewer. If care is not taken, the user may detect motion blur when viewing images from the display. One cause of motion blur is high persistence. Frames may have a typical frame duration, and light may only be emitted for a fraction of the frame duration. Persistence may refer to the length of time light is emitted during each frame. The longer the persistence, the more motion blur a user may detect. It would therefore be desirable to be able to provide improved displays with low persistence.

SUMMARY

An optical system may include equipment with a housing that is configured to receive external equipment such as a cellular telephone.

The external equipment may include a display with pixels that emit display image light. To control the persistence of the display, the optical system may include a light modulating layer. The light modulating layer may switch between a transparent state in which display image light is passed through the light modulating layer to reach the viewer and an opaque state in which display image light is blocked by the light modulating layer from reaching the viewer. The light modulating layer may be placed in the transparent state for a portion of each display frame and the opaque state for the remaining portion of each display frame.

The light modulating layer may include a liquid crystal layer that is interposed between two electrode layers. The light modulating layer may also include first and second linear polarizers. The electrode layers may be controlled to either allow or block passage of incoming light. The light modulating layer may include a twisted nematic cell. In another arrangement, the light modulating layer may be formed from switchable glass.

The light modulating layer may be divided into multiple, independently controllable zones. Each zone may be switched between the transparent state and the opaque state as desired. The light modulating layer may be formed in the housing of the equipment that receives the external equipment or may be formed with the external equipment directly.

DETAILED DESCRIPTION

Optical systems may be used to present images to a user. An optical system may use a light modulating layer to control the persistence of each frame. The light modulating layer may be selectively made transparent or opaque. Light from the display may only be received by the viewer when the light modulating layer is transparent, allowing the light modulating layer to control the persistence of the display.

Figure 1:
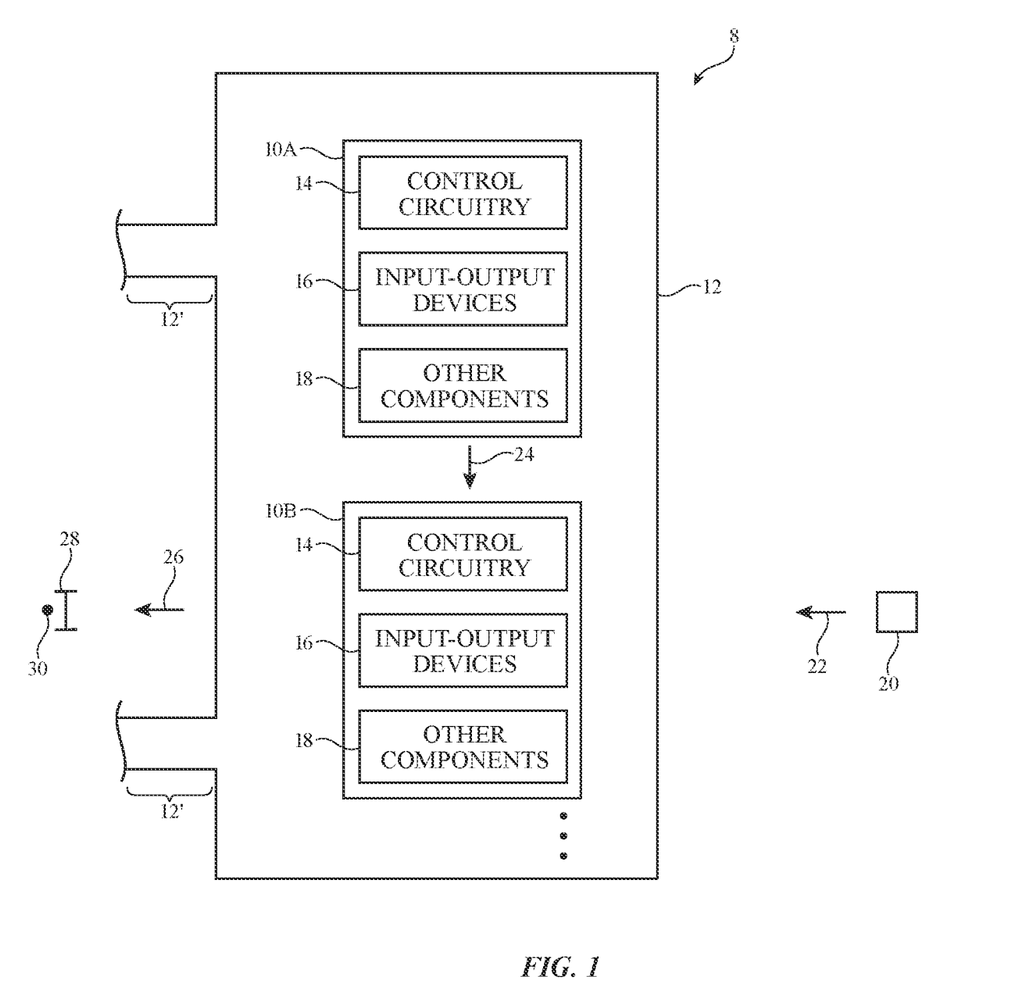
FIG. 1 is a diagram of an illustrative optical system in accordance with an embodiment.

An illustrative optical system is shown in FIG. 1. As shown in FIG. 1, optical system 8 may include equipment 10A and 10B. Equipment 10A may be, for example, a portable electronic device such as a cellular telephone. Equipment 10B may be an accessory configured to operate in combination with equipment 10A. In one illustrative example, equipment 10B may be a head-mounted device with an optical combiner. In some configurations, the components of equipment 10A and 10B may be formed as an integral unit. In other configurations, equipment 10B may serve as a support structure for equipment 10A. With this type of arrangement, equipment 10A may be used in conjunction with equipment 10B or may be used separately. Configurations for system 8 in which system 8 includes removable equipment 10A may sometimes be described herein as an example.

In the illustrative arrangement of FIG. 1, system 8 includes a support structure such as housing 12. Housing 12 may be formed from glass, polymer, metal, fabric, natural materials, ceramic, and/or other materials. Housing 12 may be configured to be worn on the head of a user. For example, housing 12 may have head-mounted portions 12' that are configured to form head-mountable support structures such as straps, helmet support structures, portions of a hat, goggles, or glasses, etc. Housing 12 may be formed as part of equipment 10B and may be configured to receive equipment 10A when it is desired to support equipment 10A during use of system 8. Housing 12 may, as an example, have portions forming a recess that receives equipment 10A and holds equipment 10A in place while equipment 10A is presenting computer-generated images on a display in equipment 10A.

Equipment 10A and/or 10B may include components such as control circuitry 14, input-output devices 16, and other components 18. Control circuitry 14 may include storage such as hard-disk storage, volatile and non-volatile memory, electrically programmable storage for forming a solid-state drive, and other memory. Control circuitry 14 may also include one or more microprocessors, microcontrollers, digital signal processors, graphics processors, baseband processors, application-specific integrated circuits, and other processing circuitry. Communications circuits in circuitry 14 may be used to transmit and receive data (e.g., wirelessly and/or over wired paths). This allows equipment 10A and 10B to communicate wirelessly and/or over a wired connection between equipment 10A and 10B. The communications circuits of circuitry 14 may also be used to support wired and/or wireless circuitry with external equipment (e.g., remote controls, host computers, on-line content servers, etc.).

In some arrangements, control circuitry 14 in equipment 10A and/or 10B may use a display in equipment 10A to display images. These images, which may sometimes be referred to as computer-generated content or computer-generated images, may be associated with a virtual world, may include pre-recorded video for a movie or other media, or may include other images. Image light 24 (display image light) from computer-generated images in equipment 10A may be provided to equipment 10B (e.g., through free space). Equipment 10B may include an optical combiner. The optical combiner may combine real-world image light 22 associated with real-world images of real-world objects 20 with display image light 24 associated with computer-generated (non-real-world) images, thereby producing merged image light 26 for viewing by viewer (viewer eye) 30 in eye box 28. System 8 may have two associated eye boxes 28 for providing images to a user's left and right eyes.

Input-output devices 16 in equipment 10A and/or 10B may be coupled to control circuitry 14 in equipment 10A and/or 10B. Input-output devices 16 may be used to gather user input from a user, may be used to make measurements on the environment surrounding device 10, may be used to provide output to a user, and/or may be used to supply output to external electronic equipment. Input-output devices 16 may include buttons, joysticks, keypads, keyboard keys, touch sensors, track pads, displays, touch screen displays, microphones, speakers, light-emitting diodes and/or lasers for providing a user with visual output, and sensors (e.g., force sensors, temperature sensors, magnetic sensor, accelerometers, gyroscopes, and/or other sensors for measuring orientation, position, and/or movement of system 8, proximity sensors, capacitive touch sensors, strain gauges, gas sensors, pressure sensors, ambient light sensors, and/or other sensors). Devices 16 can include cameras (digital image sensors) for capturing images of the user's surroundings, cameras for performing gaze detection operations by viewing eyes 30, and/or other cameras. For example, input-output devices 16 may include one or more cameras for producing data that is fused with data from an inertial measurement unit having an accelerometer, compass, and/or gyroscope for implementing a visual inertial odometry system). Devices 16 may also include depth sensors (e.g., sensors using structured light and/or using binocular cameras). In some configurations, light-based and/or radio-frequency-based sensors may be used for external object tracking (e.g., lidar, radar, and/or other detection and ranging applications).

Equipment 10A and/or 10B may also include other components 18. Components 18 may include batteries for powering the electrical components of equipment 10A and/or 10B, optical components, and/or other devices. To combine display image light 24 from a display in equipment 10A with real-world image light 22 to produce merged light 26, components 18 in equipment 10B may include an optical combiner. The optical combiner may be passive (e.g., a partially reflective mirror combiner) and/or may include one or more adjustable components (e.g., a tunable tint layer, sometimes referred to as an adjustable light modulator or adjustable light absorbing layer). Adjustable optical components in the optical combiner may impart global changes to light 22 (e.g., a global change in light intensity) and/or may be two-dimensional components (e.g., pixelated components) that can impart changes in particular regions of the optical combiner (e.g., localized increases in light absorption). This allows real-world image light 22 to be locally dimmed (as an example) to help reduce external light intensity when virtual objects in image light 24 are being overlaid on portions of a real-world scene.

Figure 2:
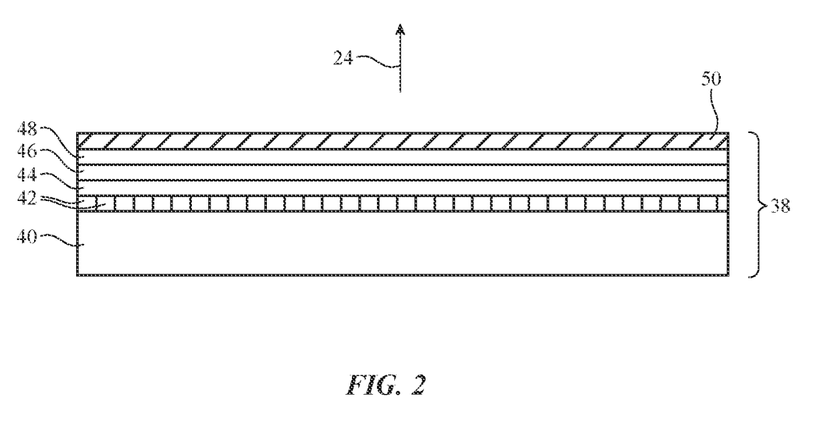
FIG. 2 is a cross-sectional side view of an illustrative display in accordance with an embodiment.

FIG. 2 is a cross-sectional side view of an illustrative display for system 8. Display 38 may be a liquid crystal display, an organic light-emitting diode display or other light-emitting diode display, a liquid crystal-on-silicon display, a microelectromechanical systems (MEMS) display, and electrophoretic display, and/or other suitable display. Display 38 may include one or more support structures such as substrate 40. An array of pixels 42 may be formed on substrate 40 to form a display. The display may emit display images (e.g., computer-generated content) based on information from control circuitry 14.

Optical layers such as layers 44, 46, 48, and/or additional layers may be formed on pixels 42 (e.g., as coating layers that overlap pixels 42). With one illustrative configuration, layer 44 is a wave plate such as a quarter wave plate and layer 46 is a linear polarizer. Together, layer 44 and layer 46 form a circular polarizer that helps suppress ambient light reflections from reflective structures in pixels 42. Layer 48 may be a wave plate such as a quarter wave plate. Emitted display image light from pixels 42 is linearly polarized upon passing through linear polarizer layer 46. After passing through quarter wave plate layer 48, this linearly polarized image light 24 may become circularly polarized (e.g., to enhance compatibility with users wearing polarized sunglasses).

Display 38 may also include a display cover layer 50. Display cover layer 50 may be a layer of clear glass, plastic, or other dielectric that covers the light-emitting surface of the underlying display pixels. In another suitable arrangement, display cover layer 50 may be a color filter layer, thin-film transistor layer, or other display layer).

Light may be emitted from display 38 in a series of display frames. Frames may have a typical frame duration, and light may only be emitted for a fraction of the frame duration. Persistence may refer to the length of time light is emitted during each frame. Persistence is proportional to motion blur perceived by the viewer. Therefore, to reduce motion blur it is desirable for display 38 to have low persistence. A light modulating layer may be incorporated to overlap display 38 to reduce persistence in the display.

Figure 3:
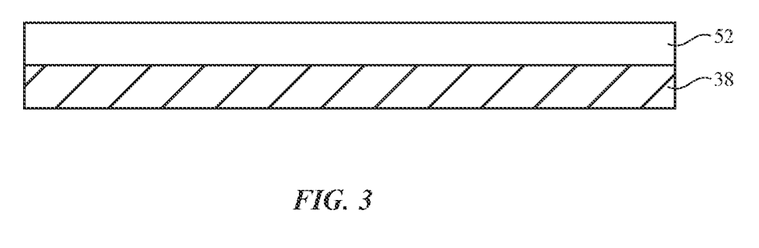
FIG. 3 is a cross-sectional side view of an illustrative light modulating layer that modulates light from a display in accordance with an embodiment.

FIG. 3 is a cross-sectional side view of an illustrative optical system with a light modulating layer that overlaps the display. Light modulating layer 52 may receive light from display 38. Light modulating layer 52 may be placed in either a transparent state or an opaque state. In the opaque state, light from display 38 is blocked from reaching the viewer of the display. In the transparent state, light from display 38 passes through light modulating layer 52 and reaches the viewer. In this way, light modulating layer 52 may be used to implement a low persistence display. For each frame, light modulating layer 52 may be made selectively transparent for only a fraction of the frame. The period of time in each frame for which light modulating layer 52 is transparent defines the persistence of that frame. The period of time in each frame for which light modulating layer 52 is transparent may take place in any desired portion(s) of the frame. For example, the light modulating layer may be in the transparent state then the opaque state in each frame, the light modulating layer may be in the opaque state then the transparent state in each frame, the light modulating layer may be in the opaque state, then the transparent state, then the opaque state in each frame, etc. In general, the period of time in each frame for which the light modulating layer is transparent may take place in any desired portion of the frame and may be split between multiple periods.

The light modulating layer may transmit any desired amount of light in the opaque state and the transparent state. The light modulating layer may have a transmittance of greater than 99%, greater than 95%, greater than 90%, greater than 80%, greater than 70%, greater than 60%, less than 99%, less than 95%, or another desired transmittance while in the transparent state. The light modulating layer may have a transmittance of less than 1%, less than 5%, less than 10%, less than 20%, less than 30%, less than 40%, greater than 1%, greater than 5%, or another desired transmittance while in the opaque state. The transmittance of the light modulating layer may be higher in the transparent state than in the opaque state.

In one embodiment, the light modulating layer may be operable in only the transparent state or the opaque state (e.g., the light modulating layer is always in either the transparent state or the opaque state). The transmittance may be the same any time the light modulating layer is in the transparent state. Alternatively, the transmittance may vary in the transparent state (e.g., in a first frame the light modulating layer may be controlled to have a transparent state with 95% transmittance and in a second frame the light modulating layer may be controlled to have a transparent state with 90% transmittance). The transmittance may be the same any time the light modulating layer is in the opaque state. Alternatively, the transmittance may vary in the opaque state (e.g., in a first frame the light modulating layer may be controlled to have a transparent state with 5% transmittance and in a second frame the light modulating layer may be controlled to have a transparent state with 10% transmittance).

Light modulating layer 52 may be formed from any desired materials capable of switching between a transparent state and an opaque state. In one illustrative embodiment, light modulating layer 52 may be formed from a layer of liquid crystal material. The layer of liquid crystal may have electrodes on either side. When a first voltage (or no voltage) is applied to the electrodes, the layer of liquid crystal material may be opaque. When a second voltage (or no voltage) is applied to the electrodes, the layer of liquid crystal material may be transparent. In one embodiment, the light modulating layer may be a twisted nematic (TN) liquid crystal cell. The light modulating layer may be a super-twisted nematic (STN) liquid crystal cell. In yet another embodiment, the light modulating layer may be a ferroelectric liquid crystal display layer. These examples are merely illustrative and other types of light modulating layers with liquid crystal material may be used if desired.

In another embodiment, light modulating layer 52 may be formed from switchable glass. Switchable glass is glass that can change from a transparent state to an opaque state. Any desired type of switchable glass may be used as light modulating layer 52. For example, light modulating layer 52 may be a suspended particle layer (in which nano-scale particles are suspended in liquid), an electrochromic layer, or any other desired type of switchable glass.

In yet another embodiment, light modulating layer 52 may be a mechanical shutter. The mechanical shutter may be formed from an opaque material that either closes in the opaque state to block light from display 38 from reaching the viewer or opens in the transparent state to allow light from display 38 to reach the viewer.

Light modulating layer 52 may be used to provide display 38 with any desired persistence. For example, the persistence may be less than 1 millisecond, less than 2 milliseconds, less than 4 milliseconds, less than 6 milliseconds, less than 10 milliseconds, less than 15 milliseconds, greater than 1 millisecond, greater than 2 milliseconds, greater than 4 milliseconds, greater than 6 milliseconds, greater than 10 milliseconds, greater than 15 milliseconds, between 1 millisecond and 6 milliseconds, between 1 millisecond and 3 milliseconds, etc.

To provide display 38 with the desired persistence, light modulating layer 52 may be synchronized with display 38. For example, light modulating layer 52 may receive a timing (control) signal from equipment 10A (e.g., from display 38 in equipment 10A) that controls the timing of the light modulating layer. The light modulating layer may then switch between the transparent and opaque states based on the received control signal from equipment 10A (even if light modulating layer is located in equipment 10B). The control signal may be a vertical synchronization (V-sync) signal, a horizontal synchronization (H-sync) signal, or a block synchronization (B-sync) signal.

Figure 4:
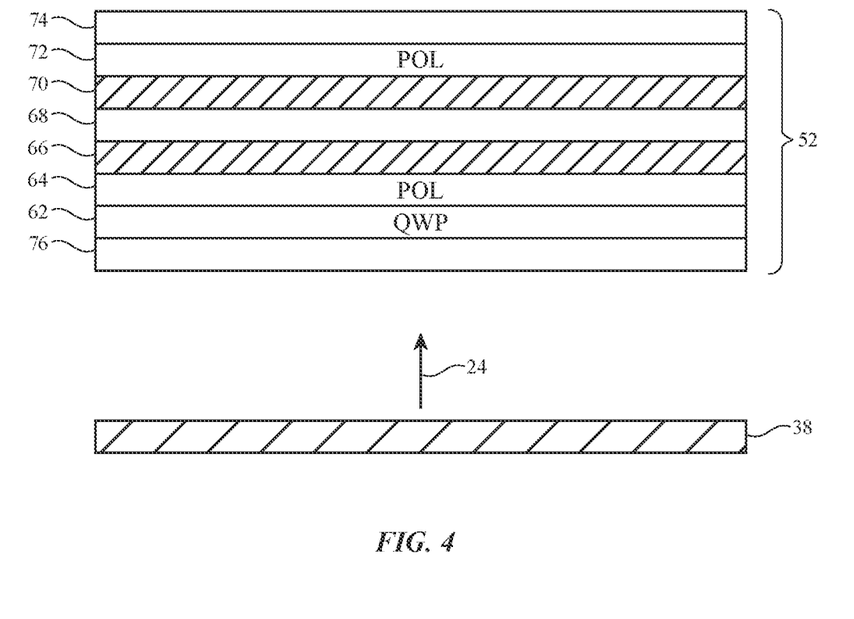
FIG. 4 is a cross-sectional side view of an illustrative light modulating layer with a twisted nematic cell that modulates light from a display in accordance with an embodiment.

An example in which light modulating layer 52 is formed using a twisted nematic (TN) cell is shown in FIG. 4. As shown in FIG. 4, light modulating layer 52 may receive light 24 from display 38. Light modulating layer 52 includes a quarter wave plate (QWP) 62, a lower linear polarizer 64 (POL), a lower electrode layer 66, a layer of liquid crystal material 68, an upper electrode layer 70, an upper linear polarizer 72 (POL), and optical layer(s) 74 and 76.

Light modulating layer 52 may receive circularly polarized light from display 38 (e.g., the display depicted in FIG. 2). Quarter wave plate 62 may convert the incoming circularly polarized light from display 38 into linearly polarized light. Linear polarizer 64 may then transmit only light of a first polarization state (whereas light of the second polarization state is not transmitted). The linearly polarized light may then pass through the twisted nematic (TN) cell formed by liquid crystal material 68, lower electrode layer 66, and upper electrode layer 70. After passing through the TN-cell, the light may pass through linear polarizer 72. Linear polarizer 72 may only transmit light of the second polarization state (whereas light of the first polarization state is not transmitted). When the light modulator layer is in an opaque state, a voltage (or no voltage) may be applied to electrodes 66 and 70 such that the light that is received (of the first polarization state) exits with the same polarization state. Therefore, the light will exit the TN-cell with the first polarization state and not be able to pass through linear polarizer 72. In contrast, when the TN-cell is in a transparent state, a voltage (or no voltage) may be applied to electrodes 66 and 70 such that the light that is received (of the first polarization state) exits with a different polarization state (e.g., the second polarization state). Therefore, the light will exit the TN-cell with the second polarization state and will pass through linear polarizer 72.

Light modulating layer 52 may optionally include one or more additional optical layers such as optical layer(s) 74 and optical layer(s) 76. Optical layers 74 may include one or more optical layers. For example, optical layers 74 may include an anti-reflection coating (ARC) to suppress reflections or a hard-coating to increase durability of the light modulating layer. In the embodiment shown in FIG. 4, light will pass through upper linear polarizer 72 of light modulating layer 52 before exiting the light modulating layer. The light emitted from light modulating layer 52 in FIG. 4 is therefore linear polarized. This example is merely illustrative. If desired, optical layers 74 may include a quarter wave plate so that circularly polarized light is emitted from the light modulating layer. Alternatively, optical layers 74 may include a half wave plate to change the polarization of the emitted linearly polarized light. Optical layers 76 may also include one or more optical layers. For example, optical layers 76 may include an anti-reflection coating (ARC) to suppress reflections or a hard-coating to increase durability of the light modulating layer.

Additional modifications may be made to the light modulating layer shown in FIG. 4. For example, additional layers may be incorporated into the light modulating layer. Each electrode may be coated with a respective polyimide layer (sometimes referred to as a liquid crystal alignment layer). For example, a liquid crystal alignment layer may be interposed between electrode 70 and liquid crystal layer 68 and a liquid crystal alignment layer maybe interposed between electrode 66 and liquid crystal layer 68. The orientations of the liquid crystal alignment layers may be configured to twist the liquid crystals in layer 68 so that in the absence of applied electric field across layer 68, linearly polarized light (e.g., light 24 that has passed through linear polarizer 64) will be rotated 90° in polarization (e.g., from the first polarization to the second polarization) as this light exits layer 68 towards the viewer.

The light modulating layer may also include an additional optical layer between lower linear polarizer 64 and lower electrode 66 and an additional optical layer between upper linear polarizer 70 and upper electrode 68. These optical layers may help ensure uniform color and luminance output, for example.

The presence of quarter wave plate 62 in light modulating layer 52 is also optional. For example, if display 38 were to emit linearly polarized light, quarter wave plate 62 may be omitted from the light modulating layer. In general, light modulating layer 52 may include any desired number and type of wave plates, polarizers, liquid crystal layers, electrodes, anti-reflective coatings, hard-coatings, and/or other type of optical layers.

In one possible embodiment, the light modulating layer may be controlled globally (meaning that either the entire light modulating layer is in the transparent state or the entire light modulating layer is in the opaque state). However, this example is merely illustrative. If desired, the light modulating layer may be split into two or more zones that are each controlled independently. Each zone may be switched between the transparent state and the opaque state as described above. However, different zones may be in different states at the same time if desired (e.g., a first zone may be transparent while a second zone is opaque).

Figure 5:
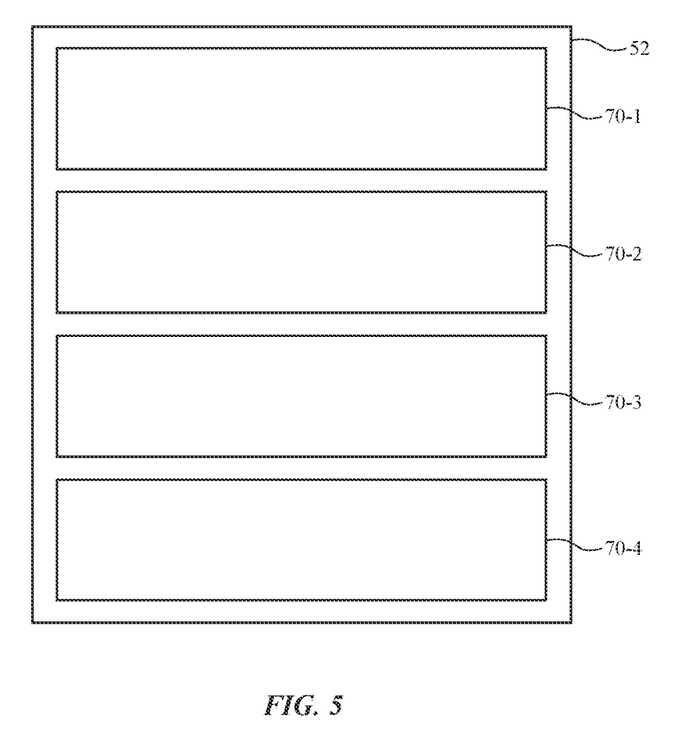
FIG. 5 is atop view of an illustrative light modulating layer with independently controllable zones in accordance with an embodiment.

A top view of a light modulating layer with separately controllable zones is shown in FIG. 5. As shown, upper electrode 70 may be patterned to have a first electrode portion 70-1, a second electrode portion 70-2, a third electrode portion 70-3, and a fourth electrode portion 70-4. Each electrode portion may be configured to receive an applied voltage to control a respective portion of the light modulating layer. For example, electrode 70-1 overlaps a first portion of the display and may be switched between a transparent state and an opaque state to control whether light from the first portion of the display reaches the viewer. Electrode 70-2 overlaps a second portion of the display and may be switched between a transparent state and an opaque state to control whether light from the second portion of the display reaches the viewer. Electrode 70-3 overlaps a third portion of the display and may be switched between a transparent state and an opaque state to control whether light from the third portion of the display reaches the viewer. Electrode 70-4 overlaps a fourth portion of the display and may be switched between a transparent state and an opaque state to control whether light from the fourth portion of the display reaches the viewer.

The example in FIG. 5 in which light modulating layer 52 has four independently controllable zones is merely illustrative. In general, light modulating layer 52 may have any desired number of independently controllable zones (e.g., two zones, three zones, four zones, more than four zones, more than six zones, more than ten zones, more than twenty zones, more than fifty zones, more than one hundred zones, more than one thousand zones, more than ten thousand zones, less than six zones, less than ten zones, less than twenty zones, less than fifty zones, less than one hundred zones, less than one thousand zones, less than ten thousand zones, etc.). Additionally, as previously discussed the light modulating layer 52 may have only one zone (e.g., controlled globally). Each zone may have any desired size (e.g., the zones may be the same size or have different sizes). Each zone may cover (e.g., receive light from) any desired number of pixel rows/columns in display 38. For example, the zones may be aligned with rows of pixels such that each zone covers a portion of a row, a single row, two or more rows, ten or more rows, a hundred or more rows, etc. Alternatively, the zones may be aligned with columns of pixels such that each zone covers a portion of a column, a single column, two or more columns, ten or more columns, a hundred or more columns, etc. The zones may have irregular shapes if desired.

The zones of light modulating layer 52 may be arranged in the same direction as the display line update direction of display 38 in equipment 10A. In the example of FIG. 5, the display line update direction may be from the top of the display to the bottom of the display (e.g., all of the pixels in the first row of the display are updated simultaneously, then all of the pixels in the second row of the display are updated simultaneously, etc.). Therefore, the zones of light modulating layer 52 are arranged to cover complete rows (and only partial columns) of the display.

In one illustrative embodiment, the zones of the light modulating layer may be controlled by a propagating control signal (sometimes referred to as dependent control). In this type of arrangement, the control of one zone will trigger the control of another zone. For example, the zones may be selectively made transparent with a control signal that propagates vertically (e.g., in the same direction as the display line update direction).

Light modulating layer 52 may be arranged in any desired manner that allows light emitted from display 38 to pass through the light modulating layer. For example, in one illustrative arrangement, the components of light modulating layer 52 may be incorporated into electronic equipment 10A (e.g., along with display 38). Electronic equipment 10A may be, for example, a cellular telephone. In this type of arrangement, the light modulating layer 52 may be considered a portion of display 38. Light emitted from display pixels in display 38 may pass through light modulating layer 52 before exiting electronic equipment 10A. For example, in the display pictured in FIG. 2, the components of light modulating layer 52 (e.g., from FIG. 4) may be interposed between display cover layer 50 and pixels 42. Alternatively, the components of light modulating layer 52 may be incorporated into equipment 10B (an accessory such as a head-mounted device configured to operate in combination with equipment 10A). The light modulating layer 52 may be incorporated into equipment 10B such that the light modulating layer overlaps and/or receives light from display 38 of equipment 10A when equipment 10A is supported by equipment 10B (e.g., housing 12 in FIG. 1 may, as an example, have portions forming a recess that receives equipment 10A and holds equipment 10A in place while equipment 10A is presenting computer-generated images on display 38 that are received by a light modulating layer in equipment 10B). In yet another embodiment, some of the components of light modulating layer 52 may be formed in equipment 10A and some of the components of light modulating layer 52 may be formed in equipment 10B.

Figure 6A:
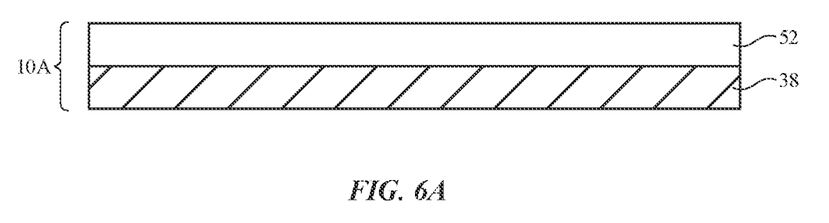
FIG. 6A is a cross-sectional side view of an illustrative light modulating layer that has been incorporated with a display in electronic equipment in accordance with an embodiment.
Figure 6B:
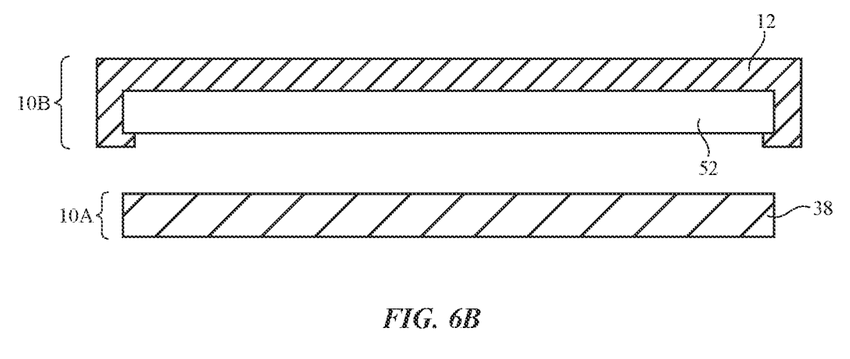
FIG. 6B is a cross-sectional side view of an illustrative light modulating layer that has been incorporated with an accessory that is configured to receive electronic equipment with a display in accordance with an embodiment.

FIGS. 6A and 6B are cross-sectional side views of illustrative arrangements for light modulating layer 52. FIG. 6A shows an embodiment where light modulating layer 52 is incorporated into electronic equipment 10A (e.g., a cellular telephone). FIG. 6B shows an alternate embodiment where light modulating layer 52 is in housing 12 of equipment 10B. As shown in FIG. 6B, housing 12 may support light modulating layer 52 in a position where light modulating layer 52 receives light from display 38 of equipment 10A when equipment 10A is operated in combination with equipment 10B. In embodiments where equipment 10B includes an optical combiner (e.g., to combine display image light 24 from a display in equipment 10A with real-world image light 22 to produce merged light 26 as shown in FIG. 1), the light modulating layer may be interposed between display 38 and the optical combiner such that display image light 24 from display 38 passes through light modulating layer 52 before reaching the optical combiner.

Regardless of whether light modulating layer 52 is positioned in equipment 10A or equipment 10B, light modulating layer 52 may be controlled by control circuitry 14 in equipment 10A and/or 10B. For example, if light modulating layer 52 is positioned in equipment 10A, the light modulating layer may be controlled by control circuitry 14 in equipment 10A, control circuitry 14 in equipment 10B, or both. Similarly, if light modulating layer 52 is positioned in equipment 10B, the light modulating layer may be controlled by control circuitry 14 in equipment 10A, control circuitry 14 in equipment 10B, or both.

In another possible embodiment, backlight strobing may be used to implement a low persistence display. For example, display 38 of equipment 10A may have a backlight that emits light that passes through pixels 42. When the backlight is on, the pixels may be illuminated and the display may emit a visible image. When the backlight is off, the pixels may not be illuminated and the display may not emit a visible image. Therefore, backlight strobing may also be used to control persistence in the display.

To control persistence, the length of time light is emitted during each display frame must be controlled. The backlight may be turned on and off to control when light is emitted during each display frame and therefore control the persistence. The backlight may be controlled globally or have independently controllable zones (similar to as discussed above in connection with FIG. 5). In general, any light source (e.g., a light source in equipment 10A, a light source in 10B, etc.) that may be turned on and off to allow pixels of display 38 to be alternately visible and not visible may be used to control the persistence in the display.

In various embodiments, equipment configured to operate in combination with external equipment that has pixels may include a housing configured to receive the external equipment and a light modulating layer in the housing that receives display image light from the pixels in the external equipment. The light modulating layer may be configured to switch between a transparent state in which the display image light passes through the light modulating layer and an opaque state in which the display image light is blocked by the light modulating layer.

The light modulating layer may include a layer of liquid crystal material. The light modulating layer may include an upper electrode layer and a lower electrode layer and the layer of liquid crystal material may be interposed between the upper electrode layer and the lower electrode layer. The light modulating layer may include first and second linear polarizers, the lower electrode layer may be interposed between the first linear polarizer and the layer of liquid crystal material, and the upper electrode layer may be interposed between the second linear polarizer and the layer of liquid crystal material. The light modulating layer may include a quarter wave plate and the first linear polarizer may be interposed between the quarter wave plate and the lower electrode layer. The quarter wave plate may receive circularly polarized display image light from the pixels in the external equipment.

The light modulating layer may include a twisted nematic cell. The light modulating layer may include switchable glass. The light modulating layer may be configured to be placed in the transparent state for a first length of time during each display frame of the pixels in the external equipment and the opaque state for a second, remaining, length of time during each display frame. The first length of time may be less than six milliseconds. The light modulating layer may have two or more zones that are each independently controllable between the transparent state and the opaque state.

To clarify, the first length of time (in the transparent state) and the second length of time (in the opaque state) in each display frame may occur in any desired order and may be split into multiple separate time periods. For example, the light modulating layer may be in the opaque state before being in the transparent state or may be in the opaque state, then the transparent state, then the opaque state in each display frame.

In various embodiments, equipment may be configured to operate in combination with external equipment that has pixels configured to emit light in a plurality of display frames and the equipment may include a housing configured to receive the external equipment and a light modulating layer in the housing that receives the light from the pixels in the external equipment. The light modulating layer may be configured to switch between a transparent state and an opaque state in each display frame of the plurality of display frames.

The light modulating layer may be configured to be placed in the transparent state for a first length of time during each display frame of the plurality of display frames and the opaque state for a second, remaining, length of time during each display frame of the plurality of display frames. The second length of time may be longer than the first length of time. The first length of time may be less than six milliseconds.

In various embodiments, equipment operable to receive real-world image light from external real-world objects may include a housing configured to receive external equipment that has pixels configured to emit display image light, an optical combiner configured to combine the display image light with the real-world image light, and a light modulating layer interposed between the external equipment and the optical combiner when the external equipment is received by the housing. The light modulating layer may be configured to switch between a first state with a first transmittance and a second state with a second transmittance that is higher than the first transmittance.

The light modulating layer may include a twisted nematic cell that has a liquid crystal layer interposed between first and second electrode layers. The light modulating layer may be configured to be placed in the second state for a subset of each display frame of the pixels. The first transmittance may be less than twenty percent and the second transmittance may be greater than eighty percent. The first transmittance may be less than ten percent and the second transmittance may be greater than ninety percent.

The foregoing is merely illustrative and various modifications can be made to the described embodiments. The foregoing embodiments may be implemented individually or in any combination.

What is claimed is:

1. Equipment configured to operate in combination with a removable electronic device that has a display with pixels, the equipment comprising:
    a housing configured to receive the removable electronic device; and
    a light modulating layer in the housing that receives display image light from the pixels in the display of the removable electronic device, wherein the light modulating layer is configured to switch between a transparent state in which the display image light passes through the light modulating layer and an opaque state in which the display image light is blocked by the light modulating layer and wherein the light modulating layer is configured to be placed in the transparent state for a first length of time during each display frame of the pixels and the opaque state for a second, remaining, length of time during each display frame.

2. The equipment defined in claim 1, wherein the light modulating layer comprises a layer of liquid crystal material.

3. The equipment defined in claim 2, wherein the light modulating layer comprises an upper electrode layer and a lower electrode layer and the layer of liquid crystal material is interposed between the upper electrode layer and the lower electrode layer.

4. The equipment defined in claim 3, wherein the light modulating layer comprises first and second linear polarizers, wherein the lower electrode layer is interposed between the first linear polarizer and the layer of liquid crystal material, and wherein the upper electrode layer is interposed between the second linear polarizer and the layer of liquid crystal material.

5. The equipment defined in claim 4, wherein the light modulating layer comprises a quarter wave plate and wherein the first linear polarizer is interposed between the quarter wave plate and the lower electrode layer.

6. The equipment defined in claim 5, wherein the quarter wave plate receives circularly polarized display image light from the pixels.

7. The equipment defined in claim 1, wherein the light modulating layer comprises a twisted nematic cell.

8. The equipment defined in claim 1, wherein the light modulating layer comprises switchable glass.

9. The equipment defined in claim 1, wherein the first length of time is less than six milliseconds.

10. The equipment defined in claim 1, wherein the light modulating layer has two or more zones that are each independently controllable between the transparent state and the opaque state.

11. Equipment configured to operate in combination with external equipment that has pixels configured to emit light in a plurality of display frames, the equipment comprising:
    a housing configured to receive the external equipment; and
    a light modulating layer in the housing that receives the light from the pixels in the external equipment, wherein the light modulating layer is configured to switch between a transparent state and an opaque state in each display frame of the plurality of display frames.

12. The equipment defined in claim 11, wherein the light modulating layer is configured to be placed in the transparent state for a first length of time during each display frame of the plurality of display frames and the opaque state for a second, remaining, length of time during each display frame of the plurality of display frames.

13. The equipment defined in claim 12, wherein the second length of time is longer than the first length of time.

14. The equipment defined in claim 12, wherein the first length of time is less than six milliseconds.

15. Equipment operable to receive real-world image light from external real-world objects, comprising:
    a housing configured to receive external equipment that has pixels configured to emit display image light;
    an optical combiner configured to combine the display image light with the real-world image light; and
    a light modulating layer interposed between the external equipment and the optical combiner when the external equipment is received by the housing, wherein the light modulating layer is configured to switch between a first state with a first transmittance and a second state with a second transmittance that is higher than the first transmittance and wherein the light modulating layer is configured to be placed in the second state for a subset of each display frame of the pixels.

16. The equipment defined in claim 15, wherein the light modulating layer comprises a twisted nematic cell that has a liquid crystal layer interposed between first and second electrode layers.

17. The equipment defined in claim 15, wherein the first transmittance is less than twenty percent and the second transmittance is greater than eighty percent.

18. The equipment defined in claim 15, wherein the first transmittance is less than ten percent and the second transmittance is greater than ninety percent.

* * * * *